(12) United States Patent
Krug

(10) Patent No.: US 6,795,696 B2
(45) Date of Patent: Sep. 21, 2004

(54) CIRCUIT CONFIGURATION FOR FILTERING A RADIO-FREQUENCY SIGNAL

(75) Inventor: Erwin Krug, München (DE)

(73) Assignee: Infineon Technologies AG, Munich (DE)

( * ) Notice: Subject to any disclaimer, the term of this patent is extended or adjusted under 35 U.S.C. 154(b) by 482 days.

(21) Appl. No.: 09/789,821

(22) Filed: Feb. 20, 2001

(65) Prior Publication Data

US 2001/0027093 A1 Oct. 4, 2001

(30) Foreign Application Priority Data

Feb. 21, 2000 (EP) .............................................. 00103653

(51) Int. Cl.$^7$ ................................................ H04B 7/00
(52) U.S. Cl. ..................... 455/266; 455/255; 455/245.2
(58) Field of Search .............................. 455/266, 245.2, 455/207, 255, 258, 264, 290, 265; 348/725, 735, 731, 707, 678

(56) References Cited

U.S. PATENT DOCUMENTS

| | | | | | |
|---|---|---|---|---|---|
| 4,214,212 A | * | 7/1980 | Dipietromaria | .......... | 455/190.1 |
| 4,270,220 A | * | 5/1981 | Hagiwara et al. | ........ | 455/182.1 |
| 4,418,428 A | * | 11/1983 | Evans | ...................... | 455/180.2 |
| 5,392,011 A | * | 2/1995 | Li | ................................ | 33/174 |
| 6,118,499 A | * | 9/2000 | Fang | .......................... | 348/726 |

FOREIGN PATENT DOCUMENTS

EP  0954097 A1  11/1999

OTHER PUBLICATIONS

"TV–Tuner ATA", Walter Klein et al., 2421 Radio Fernsehen Elektronik 45, Feb. 1995, No. 2, Berlin, Germany, pp. pertains to a large–series television tuner.

\* cited by examiner

*Primary Examiner*—Sonny Trinh
(74) *Attorney, Agent, or Firm*—Laurence A. Greenberg; Werner H. Stemer; Ralph E. Locher

(57) ABSTRACT

A circuit configuration for filtering a radio-frequency signal, in particular, in tuners for television sets, includes a control signal connection for feeding in a control signal, a controllable-frequency oscillator, at least one filter having an adjustable passband for a useful signal, and a device for providing a correction signal. The filters are, preferably, tracking filters whose filter band can be shifted by a control signal. At least one filter has a variable-frequency element with a first connection and a second connection. The first connection is coupled to the control signal connection, and the correction signal device is coupled to the second connection. For fine tuning production tolerances, the filters are supplied with a correction signal, which is applied to the other pole of the variable-frequency element of the filter as compared with the control signal. The value range of the correction signals is limited to the correction range and is much lower than the value range for the control signal.

24 Claims, 2 Drawing Sheets

CIRCUIT CONFIGURATION FOR FILTERING A RADIO-FREQUENCY SIGNAL

BACKGROUND OF THE INVENTION

Field of the Invention

The invention lies in the field of electronic circuits. The invention relates to a circuit configuration for filtering a radio-frequency signal, the circuit configuration having a controllable-frequency oscillator and a filter with an adjustable passband.

Such filter circuits are used in tuners for television sets, for example. It is a conventional practice for an antenna signal to be mixed with a local oscillator frequency and to be converted to intermediate frequency. Before mixing, filtering is necessary to filter out the useful signal band from the broadband reception signal. The characteristic of such filtering, which may be multistage, is corrected to the local oscillator signal and, hence, to the reception signal. Filters whose passband can be shifted by a control signal are known as tracking filters. However, the filter characteristics are subject to manufacture-related fluctuations. Therefore, the filter circuit is tuned during the final test. For such a purpose, correction values are ascertained from a measurement to trim the center frequency of the filters. For example, the correction values are permanently stored in a microcontroller handling system control and, after suitable digital/analog conversion, are additively superimposed on the control signal for the filter. Such circuit technology in tuners is called digital alignment.

Conventional television set tuners process tuning voltages up to a level of 35 volts. Although modern semiconductor technologies permit such dielectric strengths to be produced in principle, the demands on such semiconductor technology are considerable. The demands on the technology of the circuit are similarly complex because digital/analog converters and adders need to be configured for the full dielectric strength of up to 35 volts.

SUMMARY OF THE INVENTION

It is accordingly an object of the invention to provide a circuit configuration for filtering a radio-frequency signal that overcomes the hereinafore-mentioned disadvantages of the heretofore-known devices of this general type and that, given an appropriate level of quality in the filtering, requires lower complexity for circuitry and semiconductor processes.

With the foregoing and other objects in view, there is provided, in accordance with the invention, a circuit configuration for filtering a radio-frequency signal, including a control signal connection for feeding in a control signal, a controllable-frequency oscillator, at least one filter having an adjustable passband for a useful signal, the at least one filter having a variable-frequency element with a first connection and a second connection, the first connection being coupled to the control signal connection, and a device for providing a correction signal, the device coupled to the second connection.

A circuit configuration for filtering a radio-frequency signal according to the invention achieves these objectives by including a connection for feeding in a control signal, a controllable-frequency oscillator whose oscillating frequency can be controlled, at least one filter having an adjustable passband for a useful signal, the filter containing a variable-frequency element having a first connection and a second connection with the first connection being coupled to the connection for the control signal, and a device for providing a correction signal, the device having a connection for the correction signal, which connection is coupled to the second connection of the variable-frequency element.

In the circuit configuration according to the invention, the correction signal acts on the tuning element, which adjusts the frequency of the filter, and effects subtraction between the control signal and the correction signal. The correction signal is supplied to the other pole of the filter's tuning element, as compared with the control signal, in antiphase. Given the same dynamic range for the correction signal, the absolute range for the correction signal is much lower. The correction signals to be processed are restricted to the value range required only for correction. As a result, the affected circuit parts, such as digital/analog converters, need be constructed only for a dielectric strength in the value range of the correction signal, instead of for a value range for the entire tuning voltage, as was done previously. The effect achieved is, advantageously, that the circuit can be produced with a low dielectric strength using modern semiconductor technologies. Such configuration results in a considerable cost benefit with respect to circuit manufacture and, linked to this, for the entire filter circuit.

The variable-frequency element of the filter circuit is expediently a capacitance diode. The voltage present across the capacitance diode varies the variable capacitance of the capacitance diode. The control signal, which is also supplied to the variable-frequency oscillator, acts on the cathode connection. The correction signal is applied to the anode connection of the capacitance diode. In terms of the voltage drop across the capacitance diode, the control signal and the correction signal are superimposed as a difference. As a result, the absolute value of the correction signal can remain just at the value range intended for correction.

In accordance with another feature of the invention, the device for providing a correction signal is a digital/analog converter.

The correction signal, like the control signal, is provided as an analog signal. The correction signal is ascertained by measurement at the end of manufacture of the filter circuit. Expediently, the correction signal is permanently stored digitally in a nonvolatile memory of a microcontroller. The digital/analog converter converts the digital correction signal into the analog correction signal during operation of the filter circuit. Such microcontrollers and suitable digital/analog converters are sufficiently well known.

In accordance with a further feature of the invention, the at least one filter is at least three filters, at least two of the three filters has an adjustable passband, the at least three filters have useful signal paths connected in series, a first of the at least three filters and a second of the at least three filters connected downstream of the first of the at least three filters are bandpass filters having different passbands, and a third filter of the at least three filters is a coupled bandpass filter with a block for an image frequency of the useful signal.

In accordance with an added feature of the invention, at least two filters have an adjustable passband, the at least two filters have a signal path for the useful signal, the signal path has at least one capacitive element and an inductive element, and the second connection of the variable-frequency element is coupled to the signal path.

In accordance with an additional feature of the invention, the device has a correction signal connection, and the control signal connection and the correction signal connection are decoupled from the variable-frequency element by respective resistors.

In accordance with yet another feature of the invention, the at least one filter has a useful signal input coupled to an antenna connection at which a radio-frequency signal to be filtered can be received.

In accordance with a concomitant feature of the invention, the at least one filter has a useful signal output, the controllable-frequency oscillator has an oscillator output, and a mixer is included coupled to the oscillator output and to the useful signal output.

Altogether, filtering is performed by a plurality of adjustable filters connected in succession in terms of their useful signal, otherwise referred to as tracking filters. The input signal, which is provided by an antenna after suitable matching, is supplied to a first bandpass filter, whose center frequency is controllable. Connected downstream of the output is a second bandpass filter. The second bandpass filter, in turn, is followed by a coupled third bandpass filter, which also suppresses the image frequencies. The passband or stop band of the filters can be shifted. Such shifting is effected by a control signal. The three filters are expediently driven by the same control signal. The control signal is likewise used to adjust the frequency of the local oscillator for downward mixing to intermediate frequency. Each of the filters is also supplied with an individual correction signal ascertained based on a tuning measurement.

The filters themselves each include a signal path having inductors and capacitors connected in series. The anode connection of the variable-frequency element is coupled to the signal path. The control signal and the correction signals are applied to cathode and anode connections, respectively, of the capacitance diodes through respective resistors for the purpose of DC decoupling.

The filter circuit is used to isolate the useful signal from the reception signal at the antenna, so that the local oscillator signal corresponding to the adjusted reception channel is then used to perform the downward mixing to intermediate frequency. The fundamental area of application for the circuit is in the area of tuners for television sets. Because the market segment is extremely cost sensitive, the inexpensive tuner circuits that are made possible by the invention achieve a particular economic benefit.

Other features that are considered as characteristic for the invention are set forth in the appended claims.

Although the invention is illustrated and described herein as embodied in a circuit configuration for filtering a radio-frequency signal, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
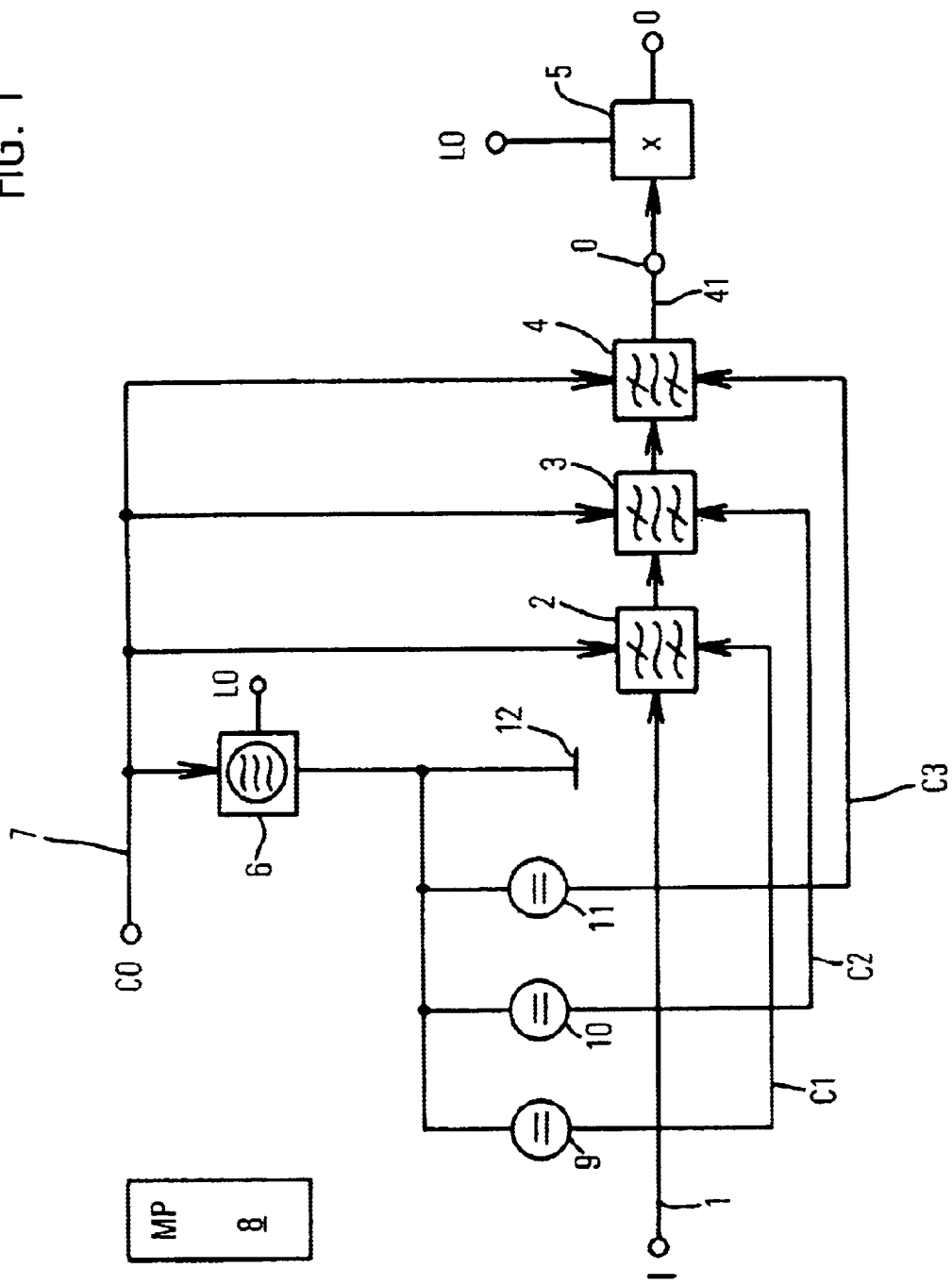
FIG. 1 is a block circuit diagram of a tuner for a television set using a filter circuit according to the invention.

In all the figures of the drawing, sub-features and integral parts that correspond to one another bear the same reference symbol in each case.

Referring now to the figures of the drawings in detail and first, particularly to FIG. 1 thereof, there is shown an input connection 1 at which is fed an input signal I derived from an antenna. The input signal I is filtered in a first bandpass filter 2, in a downstream-connected bandpass filter 3, and also in a coupled bandpass filter 4 connected downstream of the bandpass filter 3. Connected between the bandpass filters 2 and 3 is a non-illustrated amplifier. The coupled bandpass filter 4 also suppresses image frequencies. The output signal O on the output connection 41 of the band-rejection filter 4 is supplied to a downward mixer 5. In the mixer 5, the signal O is mixed with a local oscillator signal LO to obtain an output signal O' at intermediate frequency. A controllable-voltage oscillator (VCO) 6 provides the local oscillator signal LO. A control signal C0 on a connection 7 is used to adjust the frequency of the VCO 6. The circuit shown is part of a tuner for television sets. In accordance with the desired reception channel, the control signal C0 adjusts the VCO 6 to the suitable local oscillator frequency, so that the reception channel's useful signal is present in the output signal O' at intermediate frequency. To such an end, the control signal C0 likewise controls the passbands or stop bands of the filters 2, 3, 4 together to supply selectively the desired channel's radio-frequency-end reception signal to the mixer 5.

Manufacture of the filters 2, 3, 4 as a discrete circuit is subject to production tolerances. To tune the filters 2, 3, 4, a measurement is used at the end of the tuner's production process to produce a correction value that fine tunes the filters. The correction value is programmed in a nonvolatile memory of a microprocessor 8, which controls operation of the circuit. In line with the relatively broad reception range for television signals, the tuning signal C0 can have signal levels of up to 35 volts. The correction values digitally stored in the microcontroller 8 for the filters 2, 3, 4 are converted into analog correction signals C1, C2, C3 by digital/analog converters 9, 10, 11 respectively associated with the filters. The digital/analog converters 9, 10, 11 are connected to reference ground potential 12 so that the signals C1, C2, C3 take ground as reference. The absolute levels of the correction signals C1, C2, C3 are limited just to the value range required for correction. The value range encompasses ground potential 12 and is much lower than the tuning range for the control signal C0, which can extend up to 35 volts. The low value range for the correction signals C1, C2, C3 is made possible by virtue of the fact that these correction signals are applied to the frequency-determining element in the filters 2, 3, 4 in antiphase to the control signal C0. Accordingly, one connection of the frequency-determining element has the control signal C0 applied to it, as conventionally, while the respective correction signal C1, C2, or C3 is applied to the other connection of the frequency-determining element. As a result, a difference is formed between the control signal and the correction signal for the voltage drop across the frequency-determining element, which adjusts the frequency.

Figure 2:
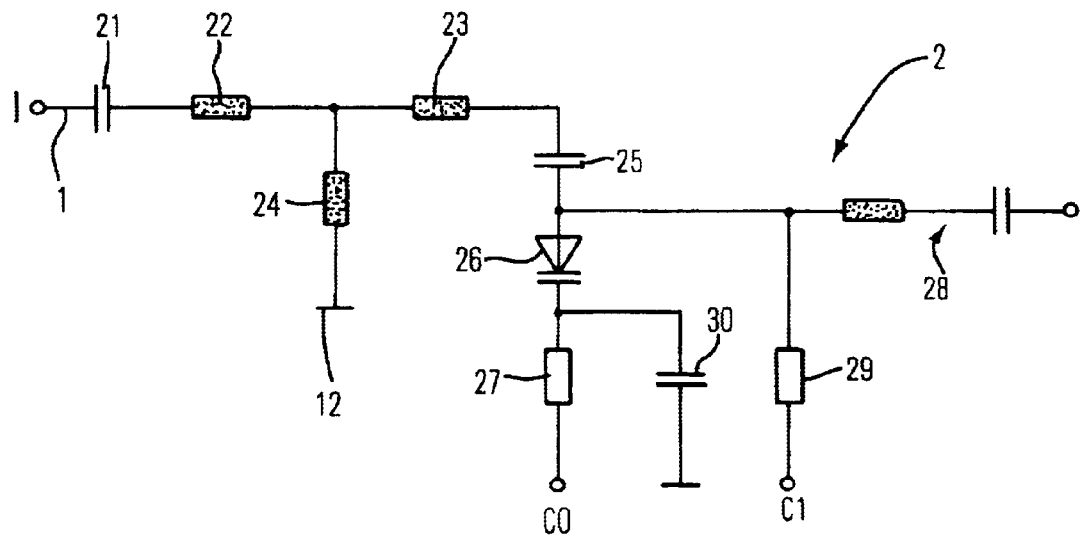
FIG. 2 is a schematic circuit diagram of a first bandpass filter of the filter circuit of FIG. 1 with only significant elements being shown.

The circuitry of the frequency-determining element is shown in FIG. 2 for the bandpass filter 2. The frequency-determining element is a capacitance diode. The signal path for the useful signal I on the connection 1 includes a coupling capacitor 21 with a downstream-connected star circuit including inductors 22, 23, 24. The two inductors 22 and 23 are in series, while the inductor 24 is connected to ground 12. Following in the signal path is a coupling capacitor 25, to which the capacitance diode 26 is connected as a frequency-determining element for the bandpass filter 2. The anode connection of the capacitance diode 26 is coupled to the capacitor 25. The control signal C0 is supplied to the cathode connection of the capacitance diode 26 through a resistor 27 for AC decoupling. The cathode connection of the capacitance diode 26 is also connected to ground through a capacitor 30. The useful signal is output from the filter 2 at the anode connection of the capacitance diode 26 through the series circuit 28 including a coil and a further coupling capacitor. In addition, the correction signal C1 is applied to the anode connection of the capacitance diode 26 through a decoupling resistor 29. Such a connection of the capacitance diode 26 enables the correction signal C1 to act in antiphase with respect to the control signal C0. Thus, the voltage drop across the capacitance diode 26 arises from the difference in the signals C0 and C1. Whereas the control signal C0 can be up to 35 volts in practice, it is sufficient for the value range of the signal C1 to be limited just to the range that is required for correction. The value range includes and is close to 0 volts. Altogether, the circuit shown in FIG. 2 makes it possible to set the center frequency of the bandpass filter based on the frequency of the local oscillator signal LO of the VCO 6 using the signal C0. The programmed, fixed correction signal C1 effects fine tuning for the purpose of compensating for production tolerances.

Figure 3:
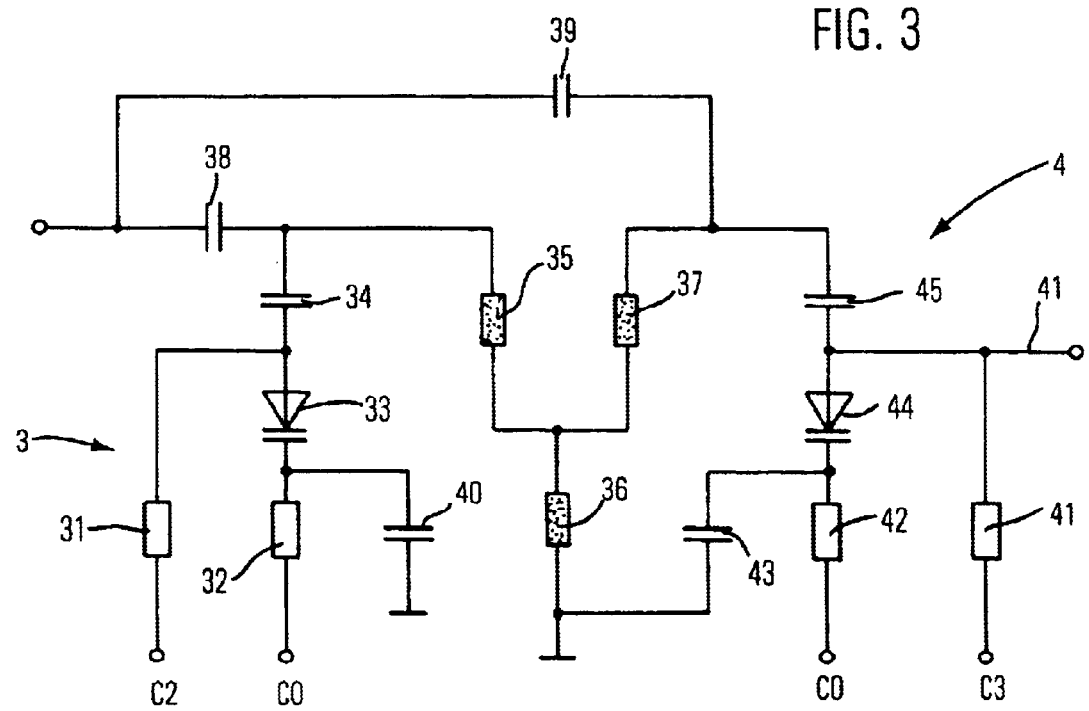
FIG. 3 is a schematic circuit diagram of a second bandpass filter and a coupled third bandpass filter of the filter circuit of FIG. 1 with only significant elements being shown.

FIG. 3 shows the bandpass filter 3 and the coupled bandpass filter 4 in combination. The signal output by the bandpass filter 2 is possibly amplified by a non-illustrated amplifier having a MOS field effect transistor, and is then supplied to the input of the filter 3. The anode connection of the capacitance diode 33 in the bandpass filter 3 is connected to the input of the filter 3 through a first and a second coupling capacitor 34, 38. Like the bandpass filter 2, the cathode connection of the capacitance diode 33 in the bandpass filter 3 has the control signal C0 applied to it through a decoupling resistor 32. In addition, the cathode connection of the capacitance diode 33 is connected to ground through a capacitor 40. The correction signal C2 is applied to the anode connection of the capacitance diode 33 through a decoupling resistor 31. The useful signal is output from the bandpass filter 3 through a star circuit including three inductors 35, 36, 37. A capacitance diode 44 forming the variable-frequency element of the bandpass filter 4 is connected to the inductor 37 through a coupling capacitor 45.

A block for the image frequency is produced by coupling the bandpass filters 4, 3 through a capacitor 39. The capacitor 39 is connected between the input of the filter 3 and the nodes between the inductor 37 and the capacitor 45. In this case too, the control signal C0 is applied to the cathode connection of the capacitance diode 44 through a decoupling resistor 42. The correction signal C3 is routed to the anode connection of the capacitance diode 44 through a decoupling resistor 41. The output signal O can be tapped off at the anode of the capacitance diode 44 through a connection 41. The cathode connection of the capacitance diode 44 is connected to ground through a capacitor 43. In relation to the cathodic control signal C0 of the capacitance diodes 33 and 44, the respectively associated correction signal C2 or C3 acts in antiphase because it is supplied at the respective anode connection of the capacitance diodes 33 and 44. Therefore, the correction signals C2 and C3 can be present at a low signal level that is a long way below the maximum signal level of up to 35 volts, which is provided for the control signal C0.

The filter circuit according to the invention permits the circuit parts for providing the correction signals C1, C2, C3, in particular, the digital/analog converters 9, 10, 11, to be manufactured for low voltage ranges using modern semiconductor process technologies.

I claim:

1. A circuit configuration for filtering a radio-frequency signal, comprising:
    a control signal connection for feeding in a control signal;
    a controllable-frequency oscillator;
    at least one filter having an adjustable passband for a useful signal, said at least one filter having a variable-frequency element with a first connection and a second connection, said first connection being coupled to said control signal connection for controlling said passband of said at least one filter; and
    a device for providing a correction signal, said device coupled to said second connection for controlling said passband of said at least one filter.

2. The circuit configuration according to claim 1, wherein said variable-frequency element is a capacitance diode having a variable capacitance, said first connection is a cathode connection of said capacitance diode, and said second connection is an anode connection of said capacitance diode.

3. The circuit configuration according to claim 1, wherein said device for providing a correction signal is a digital/analog converter.

4. The circuit configuration according to claim 1, comprising at least three filters, at least two of said three filters having an adjustable passband, said at least three filters having useful signal paths connected in series, a first of said at least three filters and a second of said at least three filters connected downstream of said first of said at least three filters being bandpass filters having different passbands, and a third filter of said at least three filters being a coupled bandpass filter with a block for an image frequency of the useful signal.

5. The circuit configuration according to claim 4, wherein said at least two filters having an adjustable passband have a signal path for the useful signal, said signal path has at least one capacitive element and an inductive element, and said second connection of said variable-frequency element is coupled to said signal path.

6. The circuit configuration according to claim 5, wherein said device has a correction signal connection, and said control signal connection and said correction signal connection are decoupled from said variable-frequency element by respective resistors.

7. The circuit configuration according to claim 6, wherein said at least one filter has a useful signal output, said controllable-frequency oscillator has an oscillator output, and including a mixer coupled to said oscillator output and to said useful signal output.

8. The circuit configuration according to claim 1, comprising at least two filters having an adjustable passband, said at least two filters having a signal path for the useful signal, said signal path having at least one capacitive element and an inductive element, and said second connection of said variable-frequency element being coupled to said signal path.

9. The circuit configuration according to claim 8, wherein said device has a correction signal connection, and said control signal connection and said correction signal connection are decoupled from said variable-frequency element by respective resistors.

10. The circuit configuration according to claim 9, wherein said at least one filter has a useful signal output, said controllable-frequency oscillator has an oscillator output, and including a mixer coupled to said oscillator output and to said useful signal output.

11. The circuit configuration according to claim 1, wherein said at least one filter has a useful signal input coupled to an antenna connection at which a radio-frequency signal to be filtered can be received.

12. The circuit configuration according to claim 1, wherein said at least one filter has a useful signal output, said controllable-frequency oscillator has an oscillator output, and including a mixer coupled to said oscillator output and to said useful signal output.

13. A circuit configuration for filtering a radio-frequency signal, comprising:
- a control signal connection for feeding in a control signal;
- at least one filter having an adjustable passband for a useful signal, said at least one filter having a variable-frequency element with a first connection and a second connection, said first connection being coupled to said control signal connection and controlling said passband of said at least one filter at least partially dependent upon said control signal;
- a correction device providing a correction signal, said correction device coupled to said second connection and controlling said passband of said at least one filter at least partially dependent upon said correction signal; and
- a controllable-frequency oscillator connected to at least one of said control signal connection and said correction device.

14. The circuit configuration according to claim 13, wherein said variable-frequency element is a capacitance diode having a variable capacitance, said first connection is a cathode connection of said capacitance diode, and said second connection is an anode connection of said capacitance diode.

15. The circuit configuration according to claim 13, wherein said correction device is a digital/analog converter.

16. The circuit configuration according to claim 13, comprising at least three filters, at least two of said three filters having an adjustable passband, said at least three filters having useful signal paths connected in series, a first of said at least three filters and a second of said at least three filters connected downstream of said first of said at least three filters being bandpass filters having different passbands, and a third filter of said at least three filters being a coupled bandpass filter with a block for an image frequency of the useful signal.

17. The circuit configuration according to claim 16, wherein said at least two filters having an adjustable passband have a signal path for the useful signal, said signal path has at least one capacitive element and an inductive element, and said second connection of said variable-frequency element is coupled to said signal path.

18. The circuit configuration according to claim 17, wherein said correction device has a correction signal connection, and said control signal connection and said correction signal connection are decoupled from said variable-frequency element by respective resistors.

19. The circuit configuration according to claim 18, wherein said at least one filter has a useful signal output, said controllable-frequency oscillator has an oscillator output, and a mixer is coupled to said oscillator output and to said useful signal output.

20. The circuit configuration according to claim 13, comprising at least two filters having an adjustable passband, said at least two filters having a signal path for the useful signal, said signal path having at least one capacitive element and an inductive element, and said second connection of said variable-frequency element being coupled to said signal path.

21. The circuit configuration according to claim 20, wherein said correction device has a correction signal connection, and said control signal connection and said correction signal connection are decoupled from said variable-frequency element by respective resistors.

22. The circuit configuration according to claim 21, wherein said at least one filter has a useful signal output, said controllable-frequency oscillator has an oscillator output, and a mixer is coupled to said oscillator output and to said useful signal output.

23. The circuit configuration according to claim 13, wherein said at least one filter has a useful signal input coupled to an antenna connection at which a radio-frequency signal to be filtered can be received.

24. The circuit configuration according to claim 13, wherein said at least one filter has a useful signal output, said controllable-frequency oscillator has an oscillator output, and a mixer is coupled to said oscillator output and to said useful signal output.

\* \* \* \* \*